(12) United States Patent
Ying (10) Patent No.: US 7,765,515 B2
(45) Date of Patent: Jul. 27, 2010

(54) PATTERN MATCH BASED OPTICAL PROXIMITY CORRECTION AND VERIFICATION OF INTEGRATED CIRCUIT LAYOUT

(75) Inventor: Changsheng Ying, San Jose, CA (US)

(73) Assignee: Anchor Semiconductor, Inc., Santa Clara, CA (US)

(*) Notice: Subject to any disclaimer, the term of this patent is extended or adjusted under 35 U.S.C. 154(b) by 457 days.

(21) Appl. No.: 11/670,975

(22) Filed: Feb. 3, 2007

(65) Prior Publication Data

US 2008/0189673 A1    Aug. 7, 2008

(51) Int. Cl.
    *G06F 17/50*    (2006.01)
(52) U.S. Cl. .......................................... 716/19; 716/20
(58) Field of Classification Search .............. 716/19–21
    See application file for complete search history.

(56) References Cited

U.S. PATENT DOCUMENTS

| | | | |
|---|---|---|---|
| 5,682,323 A | 10/1997 | Pasch | |
| 5,847,421 A | 12/1998 | Yamaguchi | |
| 5,862,058 A | 1/1999 | Samuels | |
| 6,194,252 B1 | 2/2001 | Yamaguchi | |
| 6,370,679 B1 | 4/2002 | Chang | |
| 6,425,117 B1 | 7/2002 | Pasch | |
| 7,111,277 B2 | 9/2006 | Ye | |
| 7,117,477 B2 | 10/2006 | Ye | |
| 2004/0019872 A1* | 1/2004 | Lippincott et al. | ............ 716/21 |
| 2005/0278267 A1 | 12/2005 | Mabuchi | |
| 2006/0010407 A1 | 1/2006 | Terai | |
| 2006/0010409 A1 | 1/2006 | Tamaki | |
| 2006/0117283 A1 | 6/2006 | Katou | |
| 2007/0044060 A1* | 2/2007 | Waller | .................... 716/13 |

* cited by examiner

*Primary Examiner*—Vuthe Siek
*Assistant Examiner*—Aric Lin
(74) *Attorney, Agent, or Firm*—Xin Wen (57) ABSTRACT

A method for applying optical proximity correction (OPC) to a circuit layout, includes storing distinct defect patterns in a defect pattern library and modifying the circuit layout to fix defect pattern. The method also includes storing a distinct patterns in an OPC pattern library storing one or more post-OPC targets in association with one of distinct patterns in the OPC pattern library, wherein the one or more post-OPC targets are configured to correct optical proximity effects of the associated distinct pattern. The method further includes identifying in the circuit layout a pattern that has substantially the same optical proximity environment as the one of the distinct patterns in the OPC pattern library; and applying OPC to the identified pattern using the one or more post-OPC targets associated with the one of the distinct pattern in the OPC pattern library.

21 Claims, 8 Drawing Sheets

PATTERN MATCH BASED OPTICAL PROXIMITY CORRECTION AND VERIFICATION OF INTEGRATED CIRCUIT LAYOUT

BACKGROUND

The present disclosure relates to semiconductor device manufacturing, and more particularly, to optical proximity correction in lithography and verification of circuit layout.

The fabrication of integrated circuits on a semiconductor substrate typically includes multiple photolithography steps. A photolithography step is the image transfer step, which transfers a circuit layout through photo-mask to a silicon wafer. A photolithography process begins by applying a thin layer of a photo-resist material to the substrate surface of a silicon wafer. The photo-resist is then exposed through a photolithography exposure tool called stepper or scanner to a radiation source with wavelength in DUV range that changes the solubility of the photo-resist at areas exposed to the radiation. The photo mask, which contains circuit layout information, consists of a patterned material or materials that interact with the exposing radiation through intensity and/or phase modulation.

To improve an integrated circuit (IC) functionality and performance, IC manufacturers normally shrink the circuit components and at the same time, increases the number of circuit components. It becomes necessary to reduce the size of the features, i.e., the lines and spaces that make up the circuit elements on the semiconductor substrate. The minimum feature size that can be accurately produced on a substrate is limited by the ability of the fabrication process to form an undistorted optical image of the mask pattern onto the substrate, by the chemical and physical interaction of the photo-resist with the developer, and by the uniformity of the subsequent process (e.g., etching or diffusion) that uses the patterned photo-resist.

When a photolithography system attempts to print circuit elements having sizes near and below the wavelength of the exposing radiation, the resulting shapes of the printed circuit elements become significantly different from the corresponding pattern on the mask. For example, line widths of circuit elements may vary depending on the proximity of other lines. The inconsistent line widths can then cause circuit components that should be identical to operate at different speeds, thereby creating problems with the overall operation of the integrated circuit. As another example, line ends tend to shorten or "pull back." The small amount of shortening becomes more significant as the lines themselves are made smaller Furthermore, pulling back of the line ends can cause connections to be missed or to be weakened and prone to failure.

Accordingly, Optical Proximity Correction (OPC) was developed to address lithography distortions in semiconductor manufacturing. The goal of OPC is to produce smaller features in an IC using given equipment set by enhancing the "printability" of a wafer pattern. In particular, OPC applies systematic changes to photo-mask geometries to compensate for nonlinear distortions caused by optical diffraction and resist process effects. For example, these distortions include line width variations dependent on pattern density that affect a device's speed of operation, and line end shortening that can break connections to contacts. Causes include reticule pattern fidelity, optical proximity effects, and diffusion and loading effects during resist and etch processing. A mask incorporating OPC is thus a system that seeks to negate undesirable distortion effects during pattern transfer.

OPC works by making small changes to the IC layout that anticipate the distortions. To compensate for line end shortening, the line is extended using a hammerhead shape that results in a line in the resist that is much closer to the original intended layout. To compensate for corner rounding, serif shapes are added to (or subtracted from) corners to produce corners in the silicon that are closer to the ideal layout. Determining the optimal type, size, and symmetry (or lack thereof) is very complex and depends on neighboring geometries and process parameters. Moreover, a sophisticated computer program is typically necessary to properly implement OPC.

However, applying OPC and verifying the result of OPC are not trivial endeavors. The detection of defective shapes that require OPC is very time consuming considering the huge number of electronic components and even larger number of shapes on a photo-mask.

SUMMARY

In a general aspect, the present invention relates to a method for applying optical proximity correction (OPC) to a circuit layout. The method includes storing a plurality of distinct defect patterns in a defect pattern library, identifying a defect pattern in a first circuit layout using the plurality of distinct defect patterns in the defect pattern library; modifying the first circuit layout to fix the identified defect pattern; storing a plurality of distinct patterns in an OPC pattern library, wherein each of the distinct pattern includes a distinct primary target an one or more neighboring targets adjacent to the primary target; storing one or more post-OPC targets in association with one of the plurality of distinct patterns in the OPC pattern library, wherein the one or more post-OPC targets are configured to correct optical proximity effects of the associated distinct pattern; identifying in the first circuit layout a pattern that has substantially the same optical proximity environment as the one of the plurality of distinct patterns in the OPC pattern library; and applying OPC to the identified pattern using the one or more post-OPC targets associated with the one of the distinct pattern in the OPC pattern library.

In another general aspect, the present invention relates to a method for applying optical proximity correction (OPC) to a circuit layout. The method includes storing a plurality of distinct defect patterns in a defect pattern library; identifying a defect pattern in a first circuit layout using the plurality of distinct defect patterns in the defect pattern library to produce an identified defect pattern that substantially matched one of the plurality of distinct defect patterns in the defect pattern library; replacing the identified defect pattern by a fix pattern stored in the defect pattern library in association with the identified distinct defect targets, storing a plurality of distinct patterns in an OPC pattern library, wherein each of the distinct pattern includes a distinct primary target and one or more neighboring targets adjacent to the primary target; storing one or more post-OPC targets in association with one of the plurality of distinct patterns in the OPC pattern library, wherein the one or more post-OPC targets are configured to correct optical proximity effects of the associated distinct pattern; identifying in the first circuit layout a pattern that has substantially the same optical proximity environment as the one of the plurality of distinct patterns in the OPC pattern library; and applying OPC to the identified pattern using the one or more post-OPC targets associated with the one of the distinct patterns in the OPC pattern library.

In yet another general aspect, the present invention relates to a method for applying optical proximity correction (OPC) to a circuit layout. The method includes storing a plurality of distinct defect patterns in a defect pattern library; identifying a defect target pattern in a first circuit layout using the plurality of distinct defect patterns in the defect pattern library to produce an identified defect target pattern that substantially matched one of the plurality of distinct defect patterns in the defect pattern library; replacing the identified defect pattern by a fix pattern stored in the defect pattern library in association with the identified distinct defect patterns; storing a plurality of distinct patterns in an OPC pattern library, wherein each of the distinct pattern includes a distinct primary target and one or more neighboring targets adjacent to the primary target; storing one or more post-OPC targets in association with one of the plurality of distinct patters in the OPC pattern library, wherein the one or more post-OPC targets are configured to correct optical proximity effects of the associated distinct pattern; identifying in the first circuit layout a pattern that has substantially the same optical proximity environment as the one of the plurality of distinct patterns in the OPC pattern library; applying OPC to the identified pattern by replacing the distinct primary target and targets surrounding the distinct primary target in the identified pattern by one or more post-OPC targets associated with the one of the distinct pattern in the OPC pattern library; if a pattern in the first circuit layout does not match any of the plurality of distinct patterns in the OPC pattern library, simulating the optical proximity effect of the pattern in the first circuit layout; and developing one or more post-OPC targets to replace one or more targets in the pattern in the first circuit layout to correct the optical proximity effect of the pattern in the first circuit layout.

Implementations of the system may include one or more of the following. The step of identifying a defect target pattern in a first circuit layout can include identifying a defect target that together with its surrounding targets substantially matched one of the plurality of distinct defect patterns in the defect pattern library. The step of modifying the first circuit layout to fix the identified defect pattern can include replacing the identified defect pattern by a fix pattern stored in the defect pattern library in association with the one of the plurality of distinct defect patterns that matches the identified defect target and its surrounding targets. The method can further include identifying the distinct patterns in a second circuit layout, wherein the second circuit layout is at least a portion of the first circuit layout; and developing the one or more post-OPC targets to correct optical proximity effects of the identified distinct pattern. The one or more post-OPC targets associated with the one of the distinct pattern in the OPC pattern library can be within a predetermined radius of the one of the distinct target in a circuit layout. The step of applying OPC to the identified pattern can include replacing the distinct primary target and targets surrounding the distinct primary target by the one or more post-OPC targets associated with the one of the distinct pattern in the OPC pattern library. The method can further include simulating the optical proximity effect of the pattern in the first circuit layout if a pattern in the first circuit layout does not match any of the plurality of distinct patterns in the OPC pattern library; and developing one or more post-OPC targets to replace one or more targets in the pattern in the first circuit layout to correct the optical proximity effect of the pattern in the first circuit layout. The method can further include setting a predetermined radius to define an optical proximity environment for the distinct patterns, wherein the step of applying OPC is conducted within the predetermined radius of the distinct primary target in the identified pattern in the first circuit layout. The distinct defect patterns in the defect pattern library can include one or more polygons. The plurality of distinct targets in the OPC pattern library can include one or more polygons. The step of identifying a pattern in the first circuit layout can include modeling the pattern in the first circuit layout using one or more polygons and comparing the one or more polygons with the one or more polygons associated with one of the plurality of distinct targets. The step of applying OPC to the identified pattern can be after the step of modifying the first circuit layout.

Embodiments may include one or more of the following advantages. The disclosed system and methods can improve the performance of OPC and its verification solutions using pattern match centric methodology. The disclosed system and methods provide a knowledge-based approach for performing OPC to circuit layout. The circuit features are partitioned into targets. The targets and their OPC are stored in OPC pattern library. The defective targets are stored in defect pattern library. The learning about the post-OPC targets and defect targets in a circuit design or a portion of a circuit design can be saved and can be used to in a different portion of a circuit design or a different circuit design. The accumulation of knowledge of targets' OPC and defect patterns and reduce the repeated and/or redundant data processing in OPC and its verification.

Another advantage of the disclosed system and methods is that the ripple effect in OPC can be minimized. Given a layout feature, its post-OPC target depends on the placement of its neighboring features as well as its shape. The neighboring feature's OPC depends on the neighbor's neighboring features, and so on. This is called the ripple effect in OPC. An OPC process is an iteration process that can be hard to converge due to the ripple effect. Also, due to the ripple effect, same patterns in the layout might end up with different OPC treatment. This is undesired for OPC quality control. The disclosed pattern based OPC process can converge quickly, since there are typically only limited features in a pattern. The ripple effect can be effectively avoided within a pattern in the disclosed methods and systems. The OPC can converge faster with consistent and predictable results in the disclosed systems and methods. And it is guaranteed that the same layout patterns end up with same OPC treatment.

Another advantage of the disclosed system and methods is that the amount of data expansion during OPC can be minimized. Due to the ripple effect in OPC process, the OPC data can expand many times (e.g., 10 times) larger than the original layout. In the disclosed methods and systems, native design hierarchy is extracted and maintained in a hierarchical design database for as long as possible. The pattern-based OPC method enables recognition of repeated layout patterns and a hierarchical representation of OPC data, which allows minimized layout data representation and can greatly ease tasks after OPC.

Another advantage of the disclosed system and methods is that OPC and its verification can be made a design independent process. The OPC library and defect library can be used and used for many designs. The more layout designs the disclosed OPC system processes, the larger the patterns library, and thus and shorter processing time for new designs.

The disclosed system and methods can also enable efficient distributed computing for OPC and its verification. The disclosed OPC is conducted in a pattern by pattern basis, which makes it easy to distribute OPC jobs to different computer process units (CPUs). The workload for each CPU can be easily balanced with no overhead. The OPC processing performance can thus linearly increase as the number of CPUs is increased.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles of the invention.

DETAILED DESCRIPTION

Figure 1A:
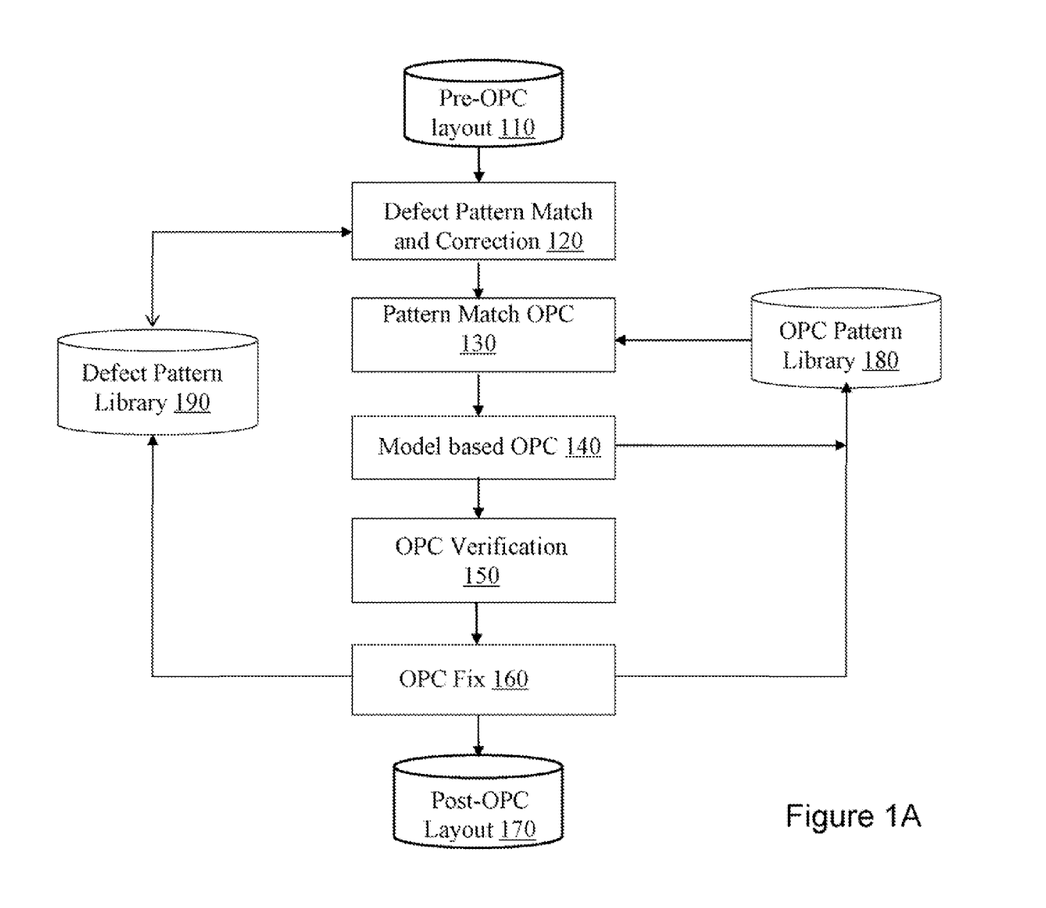
FIG. 1A is a flow diagram for cognitive optical proximity correction (OPC) and OPC verification of circuit-layout.
Figure 2:
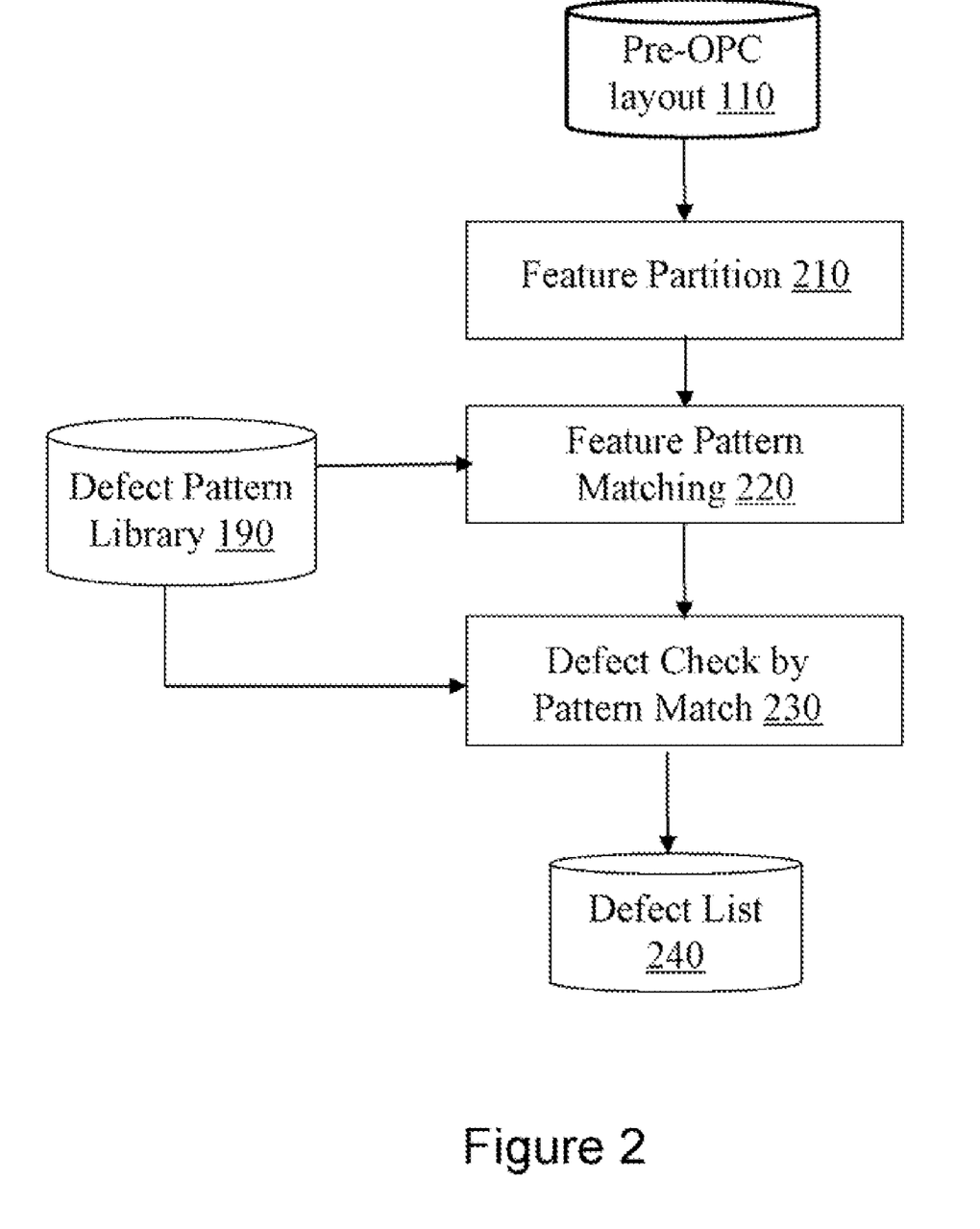
FIG. 2 is a detailed flow diagram for producing a defect list for a pre-OPC circuit layout using a defect pattern library.
Figure 6:
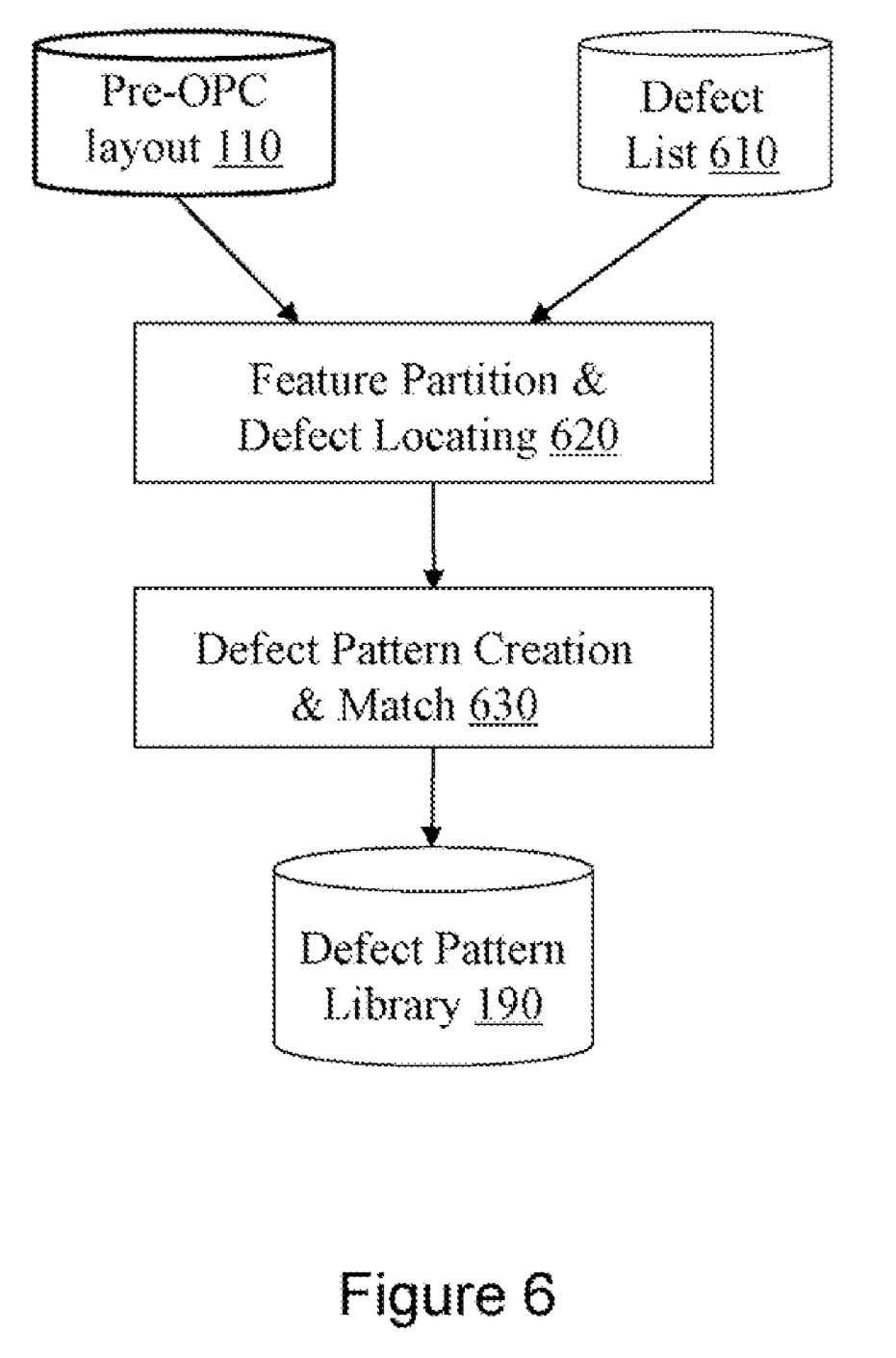
FIG. 6 is a detailed flow diagram for growing a defect pattern library and updating a defect list for a circuit layout.

Referring to FIG. 1A, a pre-OPC circuit layout is received (step 110). The pre-OPC circuit can include circuit layout of a semiconductor chip. The pre-OPC circuit layout can be from one or more layers in a multi-layer integrated circuit. The defect patterns in the pre-OPC circuit layout are next identified with the assistance of a defect pattern library 190 (step 120). The defect pattern library 190 stores a plurality of distinct defect patterns. Each defect pattern in the library includes a defect target and one or more surrounding targets in the neighborhood of the defect target. The defect pattern library 190 can also store a description of defect properties such as defect type, severity, etc., in association with the defect pattern. Given a layout and a defect list associated with the layout, a defect pattern library 190 can be built as depicted in FIG. 6 and described in related discussion. FIG. 2 shows a process to identify a list of defects associated with a pre-OPC layout 110 using the defect pattern library 190. A correction for each defect is developed (step 120). A defect can be corrected manually using a layout editing tool and/or automatically or semi-automatically using some design rule checking (DRC) tools or layout migration tools. The correction associated with a defect pattern can be also recorded and stored in association with the defect pattern to allow it to be re-used whenever a substantially the same defect pattern is found again. The correction of a target introduces one or more new targets and is called the fix-targets of the target.

The defect targets can be modeled by one or more polygonal shapes, and sorted into a list of distinct defect targets. The targets in the pre-OPC circuit layout can be molded by polygonal shapes and compared with the list of distinct defects and their surrounding targets in the defect pattern library 190. If a match is found between a target plus its surrounding targets in the pre-OPC circuit layout 110 and a distinct defect target and its surrounding targets in the defect pattern library 190, the target in the pre-OPC circuit layout 110 is identified as a defect target. The pre-OPC circuit layout will be redesigned to remove the defect targets. For example, the defect targets can be replaced by their corresponding fix targets. The detection and fixing of defect targets may take several iterations until the pre-OPC circuit layout is free of known defect patterns stored in the defect pattern library 190.

In the present specification, the term "polygon" refers to a plane figure that is bounded by closed planar paths composed of a finite number of sequential line segments. The straight line segments that make up the boundary of the polygon are called its edges or sides and the points where the edges meet are the polygon's vertices. The polygons in the present specification can include simple polygon wherein its boundary is described by exactly one closed path that has no self-intersections. The polygons in the present specification can also include other polygon types that may require several closed and non-intersecting paths to describe its boundary or include holes within its boundary.

After step 120, referring back to FIG. 1A, the targets in the pre-OPC circuit layout are next compared and matched with distinct targets in an OPC pattern library 180 (step 130). The OPC pattern library 180 can store a plurality of distinct OPC patterns. A distinct OPC pattern includes a primary target, one or more surrounding targets of the primary target. The OPC pattern library 180 can also store post-OPC targets for the primary target and the one or more surrounding targets associated with the distinct target in the optical proximity environment. A distinct primary target is a target that has a unique optical proximity environment. In general, a circuit layout can include a large number targets that have the same optical proximity environment as a distinct target in the OPC pattern library 180. Features of optical proximity environment can include the shape and dimensions of a target, the size and dimensions of surrounding targets, and the distance and relative positions between the target and the surrounding targets. The OPC pattern library 180 can also store properties such as texture type associated with the targets, and names, types, marks, usages, notes, for identifying the targets. If a match to a target in the pre-OPC circuit layout 110 is found with a primary target and the OPC environment in the OPC pattern library 180, the post-OPC target corresponding to the primary target can be obtained from the OPC pattern library 180 and applied to the target the pre-OPC circuit layout 110. This is called the pattern-match-based OPC (step 130).

The OPC pattern library 180 can be built by partitioning and analyzing targets in a portion of the pre-OPC circuit layout 110 and its corresponding OPC layout or in a different circuit layout and its corresponding OPC layout. Targets having substantially the same shape and the same surrounding targets can be classified as one distinct primary target. Post-OPC targets that correct the optical proximity effects of the distinct targets can be developed and stored in association with the distinct primary target in the OPC pattern library 180. For example, referring to FIG. 1B, the OPC pattern library 180 can include a distinct pattern consisting of a distinct primary target 10 and several surrounding targets 20-22 adjacent to the primary target 10. The distinct primary target 10 and the several surrounding targets 20-22 can have polygonal shapes such as a rectangle, a square, L-shaped pattern, an H-shaped pattern, etc. Optical distortions can occur, during masking making, to the distinct primary target 10 and the surrounding targets 20-22 due to proximity between the features in the circuit layout. The OPC pattern library 180 can also include a post-OPC target 11 that can correct optical proximity effect of the distinct primary target 10, and post-OPC targets 30-32 that can correct optical proximity effect of the surrounding targets 20-22. As shown, post-OPC target 11 and post-OPC targets 30-32 can partially overlap with the targets 10 and 20-22 respectively. A pattern can include the distinct primary target 10 and its surrounding targets 20-22.

Figure 1B:
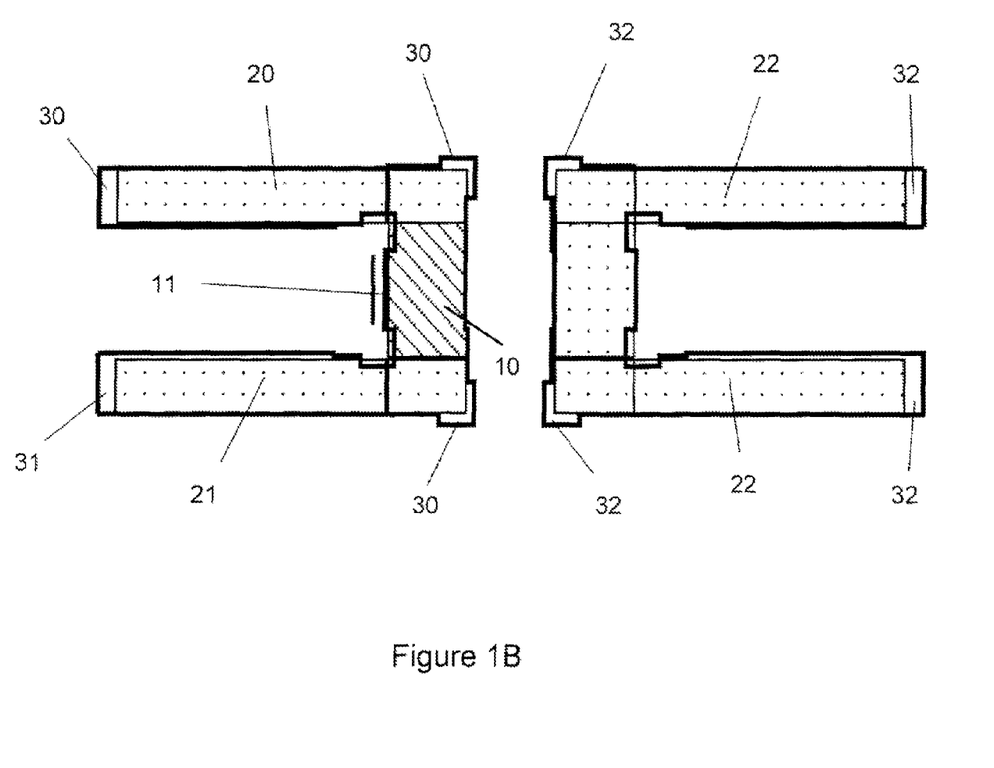
FIG. 1B illustrates an example of a primary target, its surrounding targets, and post-OPC targets.

An OPC pattern can include the post-OPC target 11 and its surrounding post-OPC targets 30-32.

Figure 1C:
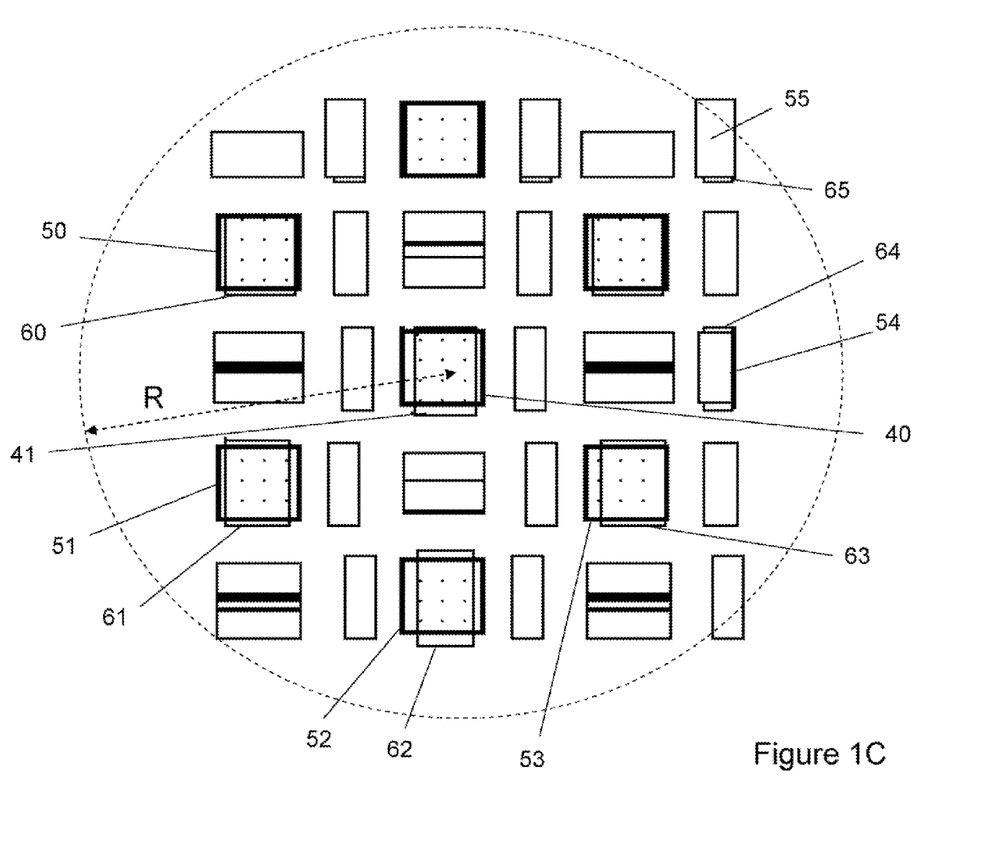
FIG. 1C illustrates another example of a primary target, its surrounding targets, and post-OPC targets.

The number of surrounding targets 20-22 around the distinct primary target 10 can be controlled to be within a predetermined radius. The larger the radius, the OPC effects can be corrected in more refined degrees, which also takes more computing processing to accomplish convergence in applying OPC to the pre-OPC circuit layout. In some embodiments, a large radius is selected for the distinct objects in the OPC pattern library 180 to allow refined OPC to be applied to the circuit layout. Referring to FIG. 1C, a distinct target 40 in the OPC pattern library 180 can include a distinct primary target 40 and a relatively large number of surrounding targets 50-55 within a relatively large radius "R". In FIG. 1C, targets are in bold line, the rest are post-OPC targets. During masking making, optical distortions can occur to the distinct primary target 40 and the surrounding targets 50-55 due to the proximity between the features in the circuit layout. The OPC pattern library 180 can store post-OPC targets 41 which can correct optical proximity effect of the distinct primary target 40, and post-OPC targets 60-66 that can correct optical proximity effect of the surrounding targets 50-55. As shown, post-OPC targets 41 and post-OPC targets 60-66 are placed nearby or partially overlap with the targets 40 and 50-55 respectively.

Referring back to FIG. 1A, after step 130, there might be many layout features in the pre-OPC layout which find no match in the OPC pattern library 180. The OPC of these features can be done by an existing OPC solution, typically, a simulation based trial and error OPC process (step 140).

The post-OPC circuit layout after the processing of the pattern match OPC (step 130) and model-based OPC (step 140) is next verified by an OPC verification procedure (step 150). The optical distortions of the layout features after OPC can be simulated and verified against the pre-OPC circuit layout intent. The additional distinct defect targets and the corresponding distinct defect target patterns (that are not stored in the defect pattern library 190) may be identified in the circuit layout at this step. Some of these newly found defect patterns can be corrected (step 160). These corrected targets can be stored in the OPC pattern library 180. Some defect patterns can not be corrected and they are added to the defect pattern library 190. These defect patterns must be gone through a new iteration. First, they must be corrected in pre-OPC fix as described in step 120. Then, they are treated for OPC and OPC verification. The end result is a post-OPC circuit layout 170 for the original pre-OPC layout 110.

FIG. 2 is a detailed flow diagram for producing a defect list 240 for a pre-OPC circuit layout 110. The pre-OPC circuit layout 110 is first partitioned (feature also referred as dissection) into targets (step 210). Each target together with its neighboring targets form a pattern, and the target is called the primary target of the pattern. The pattern is then compared and matched with the distinct defect patterns in the defect pattern library 190 (step 220). If a pattern is matched with a distinct defect pattern in the defect pattern library 190, a defect is discovered and reported in the pre-OPC layout 110 (step 230). After reviewing all the targets in the pre-OPC layout 110, a complete list of defect patterns for the pre-OPC layout 110 is obtained (step 240). These defect patterns can be corrected before going to the OPC process.

Figure 3:
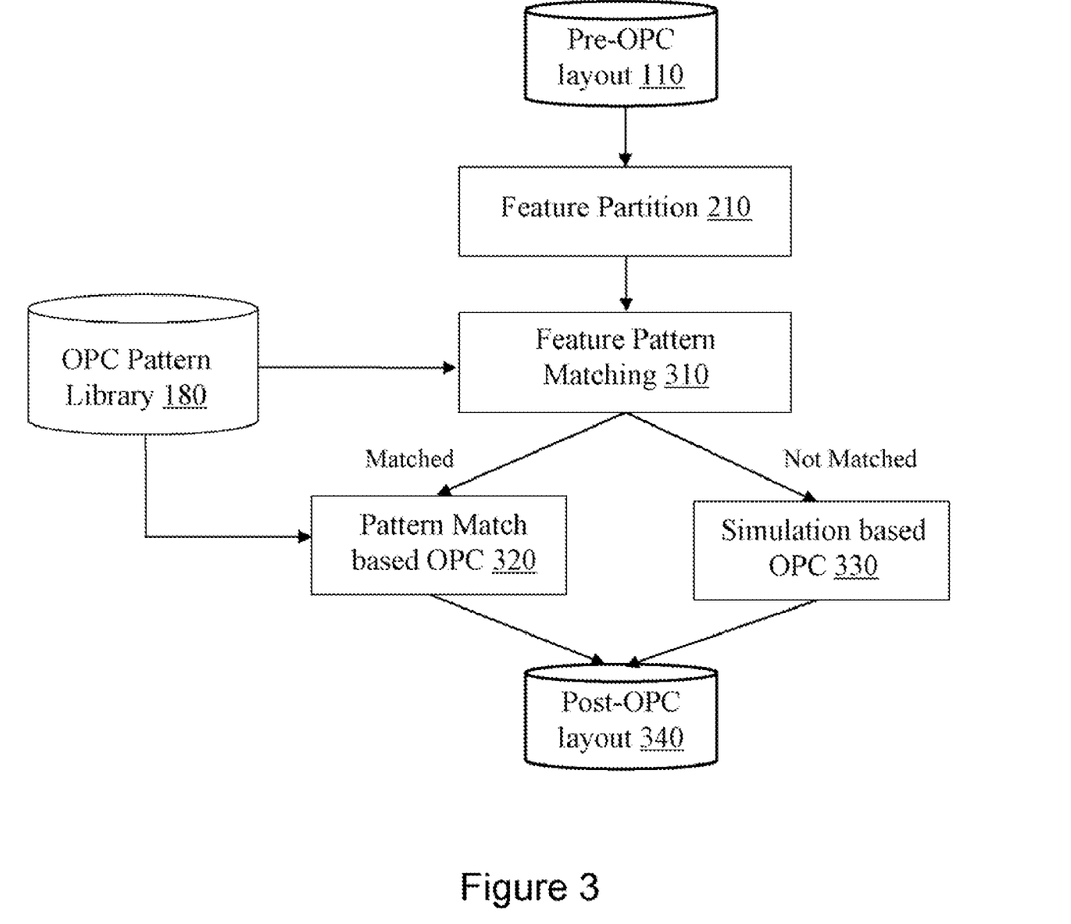
FIG. 3 is an exemplified detailed flow diagram for performing OPC using an OPC pattern library.

Referring to FIGS. 1 and 3, after the known defect targets are caught and corrected in the pre-OPC circuit layout, OPC treatment can be applied for the pre-OPC layout. An exemplified detailed flow diagram for performing OPC using an OPC pattern library 180 is shown in FIG. 3. The layout features in a pre-OPC circuit layout (110) are first partitioned to geometric-shaped targets such as boxes and polygons, same as step 210 described above. Each primary target and its surrounding targets form a pattern. Each pattern is next compared to the distinct patterns in the OPC pattern library 180 (step 310). If a match is found between a pattern in the pre-OPC circuit layout 110 and a distinct pattern in the OPC pattern library 180, pattern match based OPC is applied, namely, the post-OPC targets stored in association with the distinct target and its associated surrounding targets are simply used to replace the counterparts in the pre-OPC circuit layout (step 320). If a match is not found between a target pattern in the pre-OPC circuit layout and a distinct pattern in the OPC pattern library 180, an OPC treatment is conducted on-the-fly for the target (step 330). For example, a simulation based OPC process can simulate the optical distortions that can be produced by targets during chip mask making and make layout change to compensate the distortions. With several iterations of layout change and distortion calculation, OPC of the target can be developed to correct the anticipated optical distortions during mask making. A new OPC pattern can be formed which includes the target, surrounding targets. Post-OPC targets associated with the new OPC pattern can also be stored in the OPC pattern library 180. The new OPC patterns can be added to the OPC pattern library 180. A post-OPC layout can be produced by the combination of the pattern-based OPC results and simulation-based OPC results (step 340).

As described above, and OPC pattern library is key to do pattern match based OPC and reduce the overall OPC process run time. An OPC pattern library can be grown while doing OPC by simulation. An OPC pattern library can also be grown by learning from an existing pre-OPC layout and its corresponding post-OPC layout.

Figure 4:
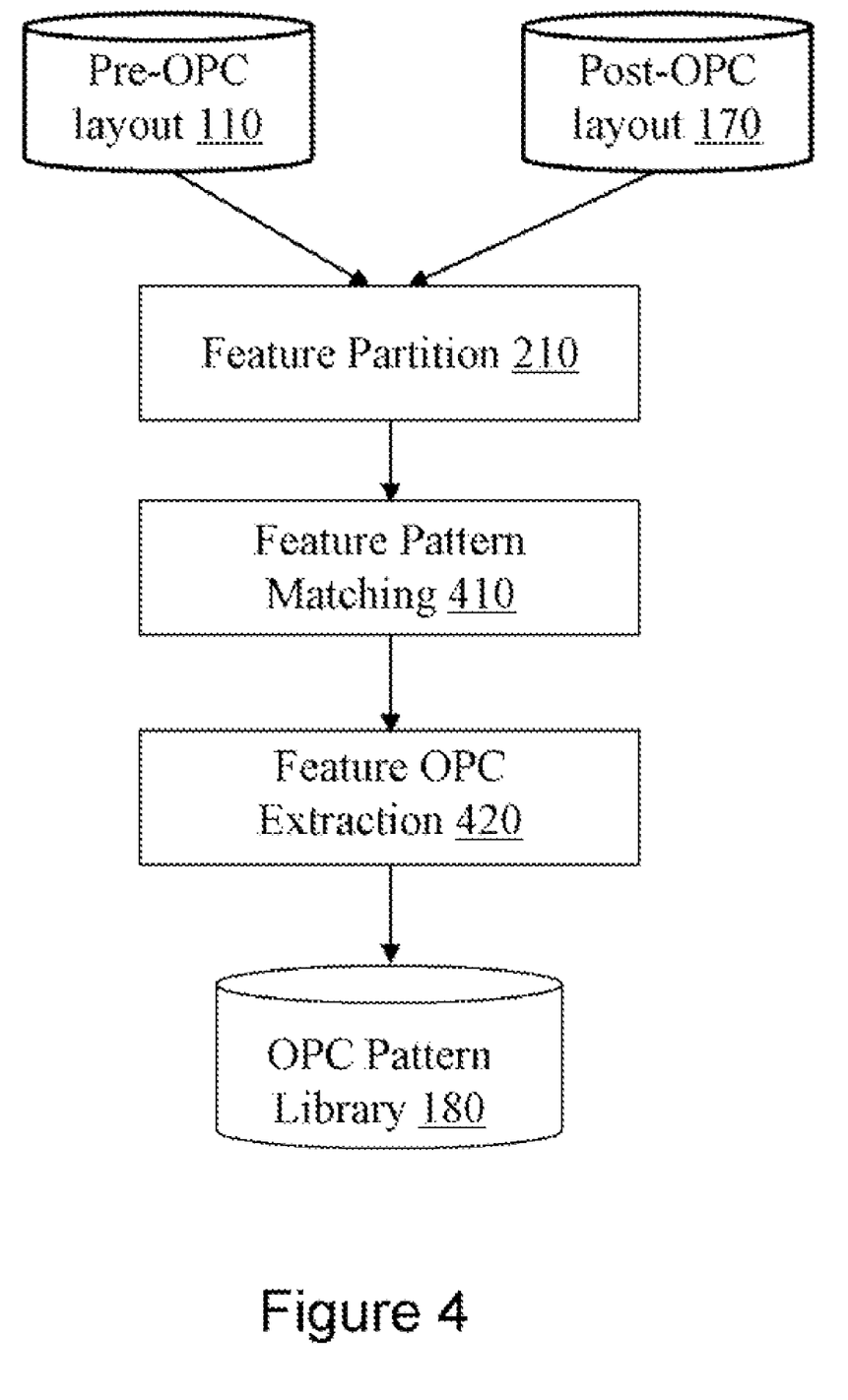
FIG. 4 is an exemplified flow diagram for growing and updating an OPC pattern library.

FIG. 4 is an exemplified flow diagram for growing and updating an OPC pattern library 180. A pre-OPC layout 110 and its corresponding post-OPC layout 170 are received as inputs. The pre-OPC layout 110 and the post-OPC layout 170 can cover much of the typical targets for OPC for the circuit layout. First, the layout features in the pre-OPC layout 110 can be partitioned into targets and patterns that include a primary target and surrounding targets, as described in step 210. The patterns can be checked against the known the distinct patterns in the OPC pattern library 180 (step 410). Each unmatched pattern is extracted i from the post-OPC layout 170 (step 420). The unmatched target and its surrounding targets, together with the extracted post-OPC targets, are added as a new distinct pattern to the OPC pattern library 180.

Figure 5:
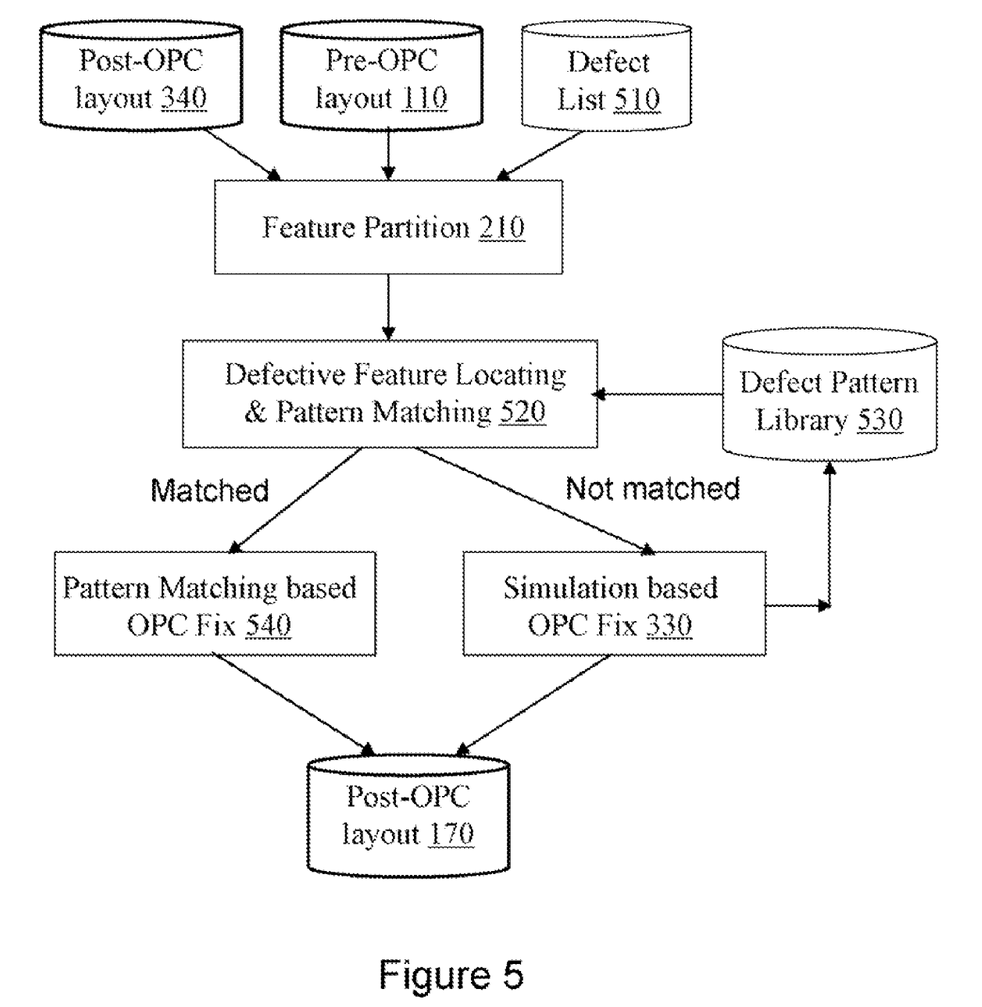
FIG. 5 is a detailed flow diagram for post-OPC fix in a circuit layout.

An exemplified detailed flow diagram for performing OPC fix is shown in FIG. 5. It starts with inputs of a pre-OPC circuit layout 110, its corresponding OPC layout 340 and a defect list 510. The post-OPC layout is the result of pattern match based OPC (step 130) and simulation based OPC (step 140). The defect list is the output of the OPC verification (step 160). First, the pre-OPC layout is partitioned into targets and forms patterns by including each target a group of adjacent targets as described in step 210. Then, locate each defect in defect list in the pre-OPC layout and associate each defect location with a target. For each target associated with a defect location, the target and its surrounding targets are compared to distinct defect patterns in a defect pattern library 530 (step 520). The defect pattern library in the context contains defect patterns and the OPC fix for the defect patterns. To begin with, this defect pattern library 530 can be empty and grows as the above described OPC fix process continues. If a defect pattern in the defect pattern library is matched, the known fix pattern of the defect pattern can be obtained from the defect pattern library. The fixes can include modifications to the OPC of defect targets and their surrounding targets. The OPC fix is applied by replacing the OPC of defective targets with the OPC fix of the targets (step 540). If no match is found for the target from the defect pattern library 190, simulation-based OPC fix can be invoked, which can be a simulation based OPC procedure same as step 330. The new defect patterns and their corresponding fix patterns can be added to the defect pattern library 530. A corrected post-OPC layout is produced after a combination of pattern-based OPC fixes and simulation-based OPC fixes (step 170).

As described above, a defect pattern library is needed to do pattern match based defect inspection in a pre-OPC layout.

FIG. 6 is a detailed flow diagram for growing a defect pattern library 190 and updating a defect list for a circuit layout. The inputs include pre-OPC circuit layout 110 and a list of defects 610. The defect list 610 can be obtained from defect inspection procedure, such as step 150 in FIG. 1. As another example, a defect list can be the output of a mask inspection tool. Or, a defect list can be manually created based on experience. First, circuit layout is partitioned into targets and target patterns are formed, as described in step 210. For each defect in the defect list 610, locate the target in the layout, and its corresponding target pattern, conduct pattern match against the defect patterns in the defect pattern library 190 (step 620). If no match is found in the defect pattern library, form a new defect pattern including the target, surrounding targets and the defect information, and add new defect patterns to the defect pattern library 190. The list of distinct defect patterns in the defect pattern library 190 can be obtained from a portion of a pre-OPC circuit layout or a different circuit layout. The distinct defect pattern represents a target and its surrounding targets, that is known to cause manufacturing problems. The distinct defect patterns are not associated with a specific location of a circuit layout, and instead are use to tabulate distinctly different defect patterns that have been accumulatively learned from past experience.

An advantage of using the OPC pattern library 180 and the defect pattern library 190 is that the knowledge learned from past can be accumulated and used to accelerate defect finding and fixing, and OPC treatment. For the targets having same shape and same surrounding targets, the OPC can be reused. As a result, the OPC computation time is significantly reduced. Similarly, defect inspection can be conducted by using pattern match method to avoid the repeated simulation based verification efforts of same targets.

The disclosed system and methods can improve the performance OPC and verification solutions using pattern match centric methodology. The disclosed system and methods provide a knowledge-based approach for performing OPC to circuit layout. The circuit features are partitioned into targets. Primary targets and their corresponding neighboring targets are grouped to form patterns. An OPC pattern library can store the patterns and post-OPC patterns that include post-OPC targets for correcting the optical proximity effects of the primary targets and their corresponding neighboring targets. The defect patterns including primary defect target and its surrounding targets are stored in defect pattern library. The learning about the post-OPC targets and defect targets in a circuit design or a portion of a circuit design can be saved and can be used to in a different portion of a circuit design or a different circuit design. The accumulation of knowledge of post-OPC targets and defect targets can drastically accelerate the speed of identifying the post-OPC targets and defect patterns and reduce the repeated and/or redundant data processing in OPC and its verification.

Another advantage of the disclosed system and methods is that the ripple effect in OPC can be minimized. Given a layout target, its post-OPC targets depends on the placement of its neighboring targets as well as its own shape. The neighboring target's OPC further depends on the neighbor's neighboring targets, and so on. This is called the ripple effect in OPC. An OPC process is computational expensive, iterative and hard to converge due to the ripple effect. The disclosed pattern based OPC process can converge quickly, since there are typically only limited targets in a target pattern. The ripple effect can be effectively avoided in patter in the disclosed methods and systems. The OPC can converge faster with consistent and predictable results in the disclosed systems and methods.

Another advantage of the disclosed system and methods is that the amount of data expansion during OPC can be minimized. Due to the ripple effect in OPC process, the OPC data can expand many times (e.g., 10 times) larger than the original layout. In the disclosed methods and systems, native design hierarchy is extracted and maintained in a hierarchical design database for as long as possible. The pattern-based OPC methods enables recognition of repeated layout patterns, which allows minimized layout data representation and can greatly ease tasks after OPC.

Another advantage of the disclosed system and methods is that OPC and its verification can be made a design independent process. The OPC library and defect library can be used and used for many designs. The more layout designs the disclosed OPC system processes, the larger the pattern library, and thus and shorter processing time.

The disclosed system and methods can also enable distributed computing. The disclosed OPC is conducted in a pattern by pattern basis, which makes it easy to distribute OPC jobs to different computer process units (CPUs). The workload for each CPU can be balanced with no overhead. The OPC processing performance can thus linearly increase as the number of CPUs is increased.

It should be understood that the disclosed systems and methods are not limited to the specific examples described above. For example, targets can be represented by many different geometric shapes and are not limited to polygons. The disclosed systems and methods can be implemented by flows and sub-flows other than those depicted above. The simulation-based OPC can use the software described above or other tools. Moreover, some distinct target stored in the OPC pattern library can be also defective. The defective targets can be fixed in past OPC fixes and in a pre-OPC fix in the next iteration of OPC.

What is claimed is:

1. A computer-assisted method for applying optical proximity correction (OPC) to a circuit layout, comprising:
    a pre-OPC process comprising:
        storing polygon-shaped defect targets in a defect pattern library in a computer storage system, wherein each polygon-shaped defect target is stored with neighboring circuit features surrounding the polygon-shaped defect target, wherein the polygon-shaped defect targets are not correctable by OPC;
        using a computer processor to identify, in a first circuit layout, a first target that matches the shape of a polygon-shaped defect target in the defect pattern library; and
        modifying the identified polygon-shaped defect target in the first circuit layout to produce modified circuit features for correction by OPC; and an OPC process comprising:
        storing polygon-shaped OPC targets in an OPC pattern library in a computer storage system, wherein each polygon-shaped OPC target is stored with neighboring circuit features surrounding the polygon-shaped OPC target, wherein the polygon-shaped OPC targets stored in the OPC pattern library are not stored in the defect pattern library;

storing post-OPC targets each in association with one of the polygon-shaped OPC targets in the OPC pattern library, wherein the post-OPC targets are configured to correct optical proximity effects of their respective polygon-shaped OPC targets;

identifying, in the first circuit layout, a second target that has substantially the same shape as a polygon-shaped OPC target in the OPC pattern library, wherein the second target has neighboring circuit features matching the neighboring features of the polygon-shaped OPC target in the OPC pattern library; and applying OPC to the second target using the post-OPC target associated with the identified polygon-shaped OPC target in the OPC pattern library.

2. The computer-assisted method of claim 1, wherein the first target comprises neighboring circuit features matching the neighboring features of the polygon-shaped defect target in the defect pattern library, wherein the step of modifying the first circuit layout comprises fixing the neighboring circuit features surrounding the first target.

3. The computer-assisted method of claim 1, wherein the OPC process further comprises:

identifying the second target in a second circuit layout; and developing the post-OPC targets to correct optical proximity effects of the second target.

4. The computer-assisted method of claim 1, wherein the neighboring circuit features surrounding the polygon-shaped OPC target are within a predetermined radius of the polygon-shaped OPC target in the first circuit layout.

5. The computer-assisted method of claim 1, wherein the step of applying OPC to the second target comprises applying OPC to the neighboring features of the second target.

6. The computer-assisted method of claim 1, further comprising:

if a third target in the first circuit layout does not match any of the polygon-shaped OPC targets in the OPC pattern library, simulating the optical proximity effect of the third target in the first circuit layout; and developing a post OPC target to replace the third target in the first circuit layout to correct the optical proximity effect of the third target in the first circuit layout.

7. The computer-assisted method of claim 6, further comprising:

if the third target is not correctable by OPC, add the third target to the defect pattern library.

8. The computer-assisted method of claim 1, further comprising:

setting a predetermined radius to define an optical proximity environment for the second target, wherein the step of applying OPC is conducted within the predetermined radius of the second target in the first circuit layout.

9. The computer-assisted method of claim 1, wherein the polygon-shaped defect targets are not stored in the OPC pattern library.

10. The computer-assisted method of claim 1, wherein the step of identifying a second target in the first circuit layout comprises modeling the second target using one or more polygons.

11. The computer-assisted method of claim 1, wherein the step of applying OPC to the second target is after the step of modifying the identified polygon-shaped defect target in the first circuit layout.

12. A computer-assisted method for applying optical proximity correction (OPC) to a circuit layout, comprising:

a pre-OPC process comprising:

storing polygon-shaped defect targets in a defect pattern library in a computer storage system, wherein each polygon-shaped defect target is stored with neighboring circuit features surrounding the polygon-shaped defect target, wherein the polygon-shaped defect targets are not correctable by OPC;

using a computer processor to identify, in a first circuit layout, a first target that matches the shape of a polygon-shaped defect target in the defect pattern library and modifying the identified polygon-shaped defect target in the first circuit layout to produce modified circuit features for correction by OPC; and an OPC process comprising:

storing polygon-shaped OPC targets in an OPC pattern library in a computer storage system, wherein each polygon-shaped OPC target is stored with neighboring circuit features surrounding the polygon-shaped OPC target, wherein the polygon-shaped OPC targets stored in the OPC pattern library are not stored in the defect pattern library, wherein the polygon-shaped OPC targets are obtained from two or more circuit layouts;

storing post-OPC targets each in association with one of the polygon-shaped OPC targets in the OPC pattern library, wherein the post-OPC targets are configured to correct optical proximity effects of their respective polygon-shaped OPC targets;

identifying, in the first circuit layout, a second target that has substantially the same shape as a polygon-shaped OPC target in the OPC pattern library, wherein the second target has neighboring circuit features matching the neighboring features of the polygon-shaped OPC target in the OPC pattern library; and applying OPC to the second target using the post-OPC target associated with the identified polygon-shaped OPC target in the OPC pattern library.

13. The computer-assisted method of claim 12, wherein the OPC process further comprises:

identifying the second target in a second circuit layout; and developing the post-OPC targets to correct optical proximity effects of the second target.

14. The computer-assisted method of claim 12, wherein the first target comprises neighboring circuit features matching the neighboring features of the polygon-shaped defect target in the defect pattern library, wherein the step of modifying the first circuit layout comprises fixing the neighboring circuit features surrounding the first target.

15. The computer-assisted method of claim 12, further comprising:

if a third target in the first circuit layout does not match any of the polygon-shaped OPC targets-in the OPC pattern library, simulating the optical proximity effect of the third target in the first circuit layout; and developing a post OPC target to replace the third target in the first circuit layout to correct the optical proximity effect of the third target in the first circuit layout.

16. The computer-assisted method of claim 12, further comprising setting a predetermined radius to define an optical proximity environment for the second target, wherein the step of applying OPC is conducted within the predetermined radius of the second target in the first circuit layout.

17. The computer-assisted method of claim 16, wherein the step of identifying a second target in the first circuit layout comprises modeling the second target using one or more polygons.

18. The computer-assisted method of claim 12, wherein the polygon-shaped defect targets are not stored in the OPC pattern library.

19. A computer-assisted method for applying optical proximity correction (OPC) to a circuit layout, comprising:
   a pre-OPC process comprising:
      storing polygon-shaped defect targets in a defect pattern library in a computer storage system, wherein each polygon-shaped defect target is stored with neighboring circuit features surrounding the polygon-shaped defect target, wherein the polygon-shaped defect targets are not correctable by OPC;
      using a computer processor to identify, in a first circuit layout, a first target that matches the shape of a polygon-shaped defect target in the defect pattern library, wherein the first target comprises neighboring circuit features matching the neighboring features of the polygon-shaped defect target in the defect pattern library; and
      modifying the identified polygon-shaped defect target in the first circuit layout to produce modified circuit features for correction by OPC; and an OPC process comprising:
      storing polygon-shaped OPC targets in an OPC pattern library in a computer storage system, wherein each polygon-shaped OPC target is stored with neighboring circuit features surrounding the polygon-shaped OPC target, wherein the polygon-shaped OPC targets stored in the OPC pattern library are not stored in the defect pattern library;
      storing post-OPC targets each in association with one of the polygon-shaped OPC targets in the OPC pattern library, wherein the post-OPC targets are configured to correct optical proximity effects of their respective polygon-shaped OPC targets;
      using a plurality of computer processors in communication with the computer storage system to identify, in the first circuit layout, a second target that has substantially the same shape as a polygon-shaped OPC target in the OPC pattern library, wherein the second target has neighboring circuit features matching the neighboring features of the polygon-shaped OPC target in the OPC pattern library; and
      applying OPC to the second target using the post-OPC target associated with the identified polygon-shaped OPC target in the OPC pattern library.

20. The computer-assisted method of claim 19, further comprising:
   if a third target in the first circuit layout does not match any of the polygon-shaped OPC targets in the OPC pattern library, simulating the optical proximity effect of the third target in the first circuit layout; and
   developing a post OPC target to replace the third target in the first circuit layout to correct the optical proximity effect of the third target in the first circuit layout.

21. The computer-assisted method of claim 20, further comprising:
   if the third target is not correctable by OPC, add the third target to the defect pattern library.

* * * * *